(12) United States Patent
Charpin-Nicolle et al.

(10) Patent No.: US 10,297,641 B2
(45) Date of Patent: May 21, 2019

(54) MEMORY DEVICE

(71) Applicant: Commissariat A L'Energie Atomique et aux Energies Alternatives, Paris (FR)

(72) Inventors: Christelle Charpin-Nicolle, Fontanil-Cornillon (FR); Eric Jalaguier, Saint Martin d'Uriage (FR); Luca Perniola, Noyarey (FR); Ludovic Poupinet, Sassenage (FR); Boubacar Traore, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 46 days.

(21) Appl. No.: 15/223,214

(22) Filed: Jul. 29, 2016

(65) Prior Publication Data
US 2017/0033160 A1    Feb. 2, 2017

(30) Foreign Application Priority Data
Jul. 31, 2015    (FR) ..................... 15 57363

(51) Int. Cl.
*H01L 27/24* (2006.01)
*H01L 45/00* (2006.01)

(52) U.S. Cl.
CPC .......... *H01L 27/2463* (2013.01); *H01L 45/08* (2013.01); *H01L 45/1233* (2013.01); *H01L 45/1253* (2013.01); *H01L 45/1266* (2013.01); *H01L 45/1273* (2013.01); *H01L 45/145* (2013.01); *H01L 45/146* (2013.01); *H01L 45/1675* (2013.01); *H01L 45/1683* (2013.01)

(58) Field of Classification Search
CPC . H01L 27/2463; H01L 45/08; H01L 45/1233; H01L 45/1253; H01L 45/1266; H01L 45/1273; H01L 45/146; H01L 45/1675; H01L 45/1683; H01L 45/145–45/147; H01L 45/16–45/1691
See application file for complete search history.

(56) References Cited

U.S. PATENT DOCUMENTS

| | | | |
|---|---|---|---|
| 2010/0032636 A1* | 2/2010 | Jin | ........................ H01L 45/085 257/2 |
| 2011/0017977 A1 | 1/2011 | Bratkovski et al. | |

(Continued)

OTHER PUBLICATIONS

French Preliminary Search Report dated Apr. 27, 2016 in French Application 15 57363, filed on Jul. 31, 2015 ( with Written Opinion and English Translation of Categories of cited documents).

(Continued)

*Primary Examiner* — Cuong B Nguyen
(74) *Attorney, Agent, or Firm* — Oblon, McClelland, Maier & Neustadt, L.L.P.

(57) ABSTRACT

A memory device, containing a first electrode, a second electrode and an oxide layer arranged between the first electrode and the second electrode, is produced. The oxide layer has a first zone and a second zone, with the first zone surrounding or being located on either side of the second zone, with the minimum distance d2 separating the two electrodes on the second zone of the oxide layer being less than the minimum distance d1 separating the two electrodes on the first zone of the oxide layer.

25 Claims, 7 Drawing Sheets

(56) References Cited

U.S. PATENT DOCUMENTS

2015/0041748 A1     2/2015  Hayakawa et al.
2015/0171095 A1     6/2015  Wang et al.
2015/0311435 A1*   10/2015  Liu .................... H01L 45/1233
                                                              257/4

OTHER PUBLICATIONS

M. Argoud et al. "300mm pilot line DSA contact hole process stability", Proc of SPIE, 2014, 11 pages.

Yang Yin Chen et al. "Endurance/Retention Trade-off on $HfO_2$/Metal Cap 1T1R Bipolar RRAM", IEEE Transactions on Electron Devices, vol. 60, No. 3, 2013, 8 pages.

B. Govoreanu et al. $10x10nm^2$ Hf/$HfO_x$, Crossbar Resistive RAM with Excellent Performance, Reliability and Low-Energy Operation, IEDM11, 2011, 4 pages.

Kyung-Chang Ryoo et al. "Conductive Filament Control in Highly Scalable Unipolar Resistive Switching Devices for Low-Power and High-Density Next Generation Memory", IEDM 2013, 3 pages.

B. Butcher et al. "Hot Forming to Improve Memory Window and Uniformity of Low-Power $HfO_x$-Based RRAMs", 2012 $4^{th}$ IEEE International Memory Workshop, 2012 1 page.

R. Yasuhara et al. "Consideration of conductive filament for realization of low-current and highly-reliable TaOx ReRAM", 2013 $5^{th}$ IEEE International Memory Workshop, 2013, 1 page.

* cited by examiner

MEMORY DEVICE

CROSS-REFERENCE TO RELATED APPLICATION

This application is based upon and claims the benefit of priority to French Application No. 15 57363, which was filed on Jul. 31, 2015.

FIELD OF THE INVENTION

This invention relates to, in general, a resistive memory device, and more particularly, a non-volatile resistive memory device and the manufacturing method thereof.

TECHNOLOGICAL BACKGROUND

Resistive memories of the OxRRAM (Oxide-Based Resistive Random Access Memories) type that typically comprise a layer of metal oxide, are preferentially chosen for non-volatile applications, with the purpose of replacing memories of the Flash type. They in particular have the advantage of being compatible with the end of line method (acronym BEOL for "Back-End Of Line") of the CMOS technology (acronym for "Complementary Metal-Oxide-Semiconductor"). OxRRAM resistive memories are devices that comprise in particular a layer of metal oxide arranged between two electrodes. The electrical resistance of such devices can be modified by writing and erasing operations. These writing and erasing operations make it possible to switch the OxRAM resistive memory device from a low resistive state (LRS) to a high resistive state (HRS) and inversely.

From cycle to cycle, the resistances of the low resistive LRS and high resistive HRS states do not show very good reproducibility in terms of performance. A variability in cycle-to-cycle performance is indeed observed. This variability is especially substantial for the high resistive state HRS, inducing a decrease in the programming window, and even a total loss of the programming window. This problem of variability is a genuine obstacle for industrialization.

This problem remains despite many efforts made in the fields of methods for creating resistive memory devices and programming methods.

Many studies have been conducted in order to reduce the variability of electrical performance by reducing the dimensions of the memory device. In particular, it has been shown in the publication: "Conductive Filament Control in Highly Scalable Unipolar Resistive Switching Devices for Low-Power and High-density Next Generation Memory", Kyung-Chang Ryoo et al., IEDM2013, that a solution for reducing the dimensions of the memory device is to reduce the contact surface between one of the electrodes and the oxide layer.

FIG. 1A shows a memory device comprising a metal oxide layer 300 arranged between a first electrode 100 and a second 200 electrode, according to prior art. Conductive filaments 500 are created through the oxide layer 300. It appears that the conductive filaments 500 can be dispersed on the contact surfaces that separate each one of the electrodes 100, 200 from the oxide layer 300. This dispersion of conductive filaments 500 in the oxide layer 300 can be responsible for the variability in performance, observed for resistive memory devices of prior art.

FIG. 1B shows a memory device comprising an oxide layer 300 arranged between a first electrode 100 and a second electrode 200, according to prior art. The device shows a reduced contact surface between the second electrode 200 and the oxide layer 300. It appears that the conductive filaments 500 are directed towards the reduced contact surface.

The disadvantage with this type of memory device is the complexity of the manufacturing method. Indeed, in order to form a reduced contact surface between the second electrode and the oxide layer, it is necessary to carry out many and therefore expensive steps. In particular, the steps of lithography, depositing, planarization, required for obtaining nanometric dimensions on the contact between the electrodes and the dielectric material are complex and require complicated development steps. Moreover, making contact on a small surface inevitably results in additional constraints in terms of industrialization.

This invention makes it possible to resolve all or, at least a portion of the disadvantages of current techniques. It would in particular be advantageous to propose a solution to reduce and even eliminate the variability in performance observed cycle after cycle for resistive memory devices, while still limiting or avoiding the disadvantaged of the manufacturing methods known in prior art mentioned hereinabove.

SUMMARY OF THE INVENTION

This invention relates to a memory device comprising an oxide layer arranged between a first electrode and a second electrode. Advantageously, the oxide layer has a first zone and a second zone, with the first zone surrounding or being located on either side of the second zone, with the minimum distance d2 separating the first and second electrodes on the second zone of the oxide layer being less than the minimum distance d1 separating the two electrodes on the first zone of the oxide layer.

When the contact surface between at least one electrode among the first electrode and the second electrode and the oxide layer is substantial, the number of parasite paths of conductive filaments that can be created during the steps of programming is high; which can generate substantial variability in cycle-to-cycle performance.

Advantageously, and according to a preferred but not limiting embodiment of the invention, in order to reduce this instability, the contact surface between at least one electrode among the first and second electrodes, preferentially chosen non-inert, i.e. having a strong chemical interaction with the oxide layer, and the second zone of said oxide layer is reduced. The other electrode among the two electrodes is preferentially inert, i.e. that is not able to react with the oxide layer.

Although controlling the concentration in oxygen of the conductive filament makes it possible to carry out cycles at low current and better retention of information, this invention does not require an adjustment of the thickness of the metal-oxide layer (for example with a $TaO_x$ base) forming at least one of the electrodes. Controlling the concentration of oxygen in the conductive filament is generally difficult to observe and thus to control.

Advantageously, this invention has an alternative solution that does not require a modification to the manufacturing of the memory device following an adjustment of the layer of $TaO_x$ for example.

Particularly advantageously, this invention makes it possible to not reduce the transversal dimension (extending perpendicularly to the plane of the substrate) of the oxide layer. However, in the framework of the development of this invention, it has been observed that the reduction in the transversal dimension of the oxide layer (such as following, for example, a self-aligned etching of one of the electrodes and of the oxide layer) is to be avoided because that is the same as bringing the interfaces of the metal oxide layer close to the passivation oxide that surrounds said oxide layer. These interfaces could play a negative role in the operation of the memory device, preferentially of the OxRRAM type, by the creation of parasite defect paths near these interfaces. As such, this invention advantageously makes it possible to retain a certain proportion between the surface of at least one electrode among the first and second electrodes and the surface of the metal-oxide layer. The main problem is that when the dimensions of the memory cell are reduced by lithography and/or by etching, it is not easy to realize contact at the top of the memory point; this requires steps of lithography with good control of the superposition performance (overlay).

The synergy, existing between the dimensions of contact surfaces between at least one electrode among the first and second electrodes and the first and second zones as well as between the distances d1 and d2, makes it possible to overcome the problems of instability (or variability) cycle after cycle by acting on the control, and more precisely on the confining, of the conductive filament in the second zone.

Advantageously, this invention makes it possible to confine the zone of formation of the conductive filament, while still retaining facing electrode surfaces of large dimensions, said electrodes will be easier to carry out technologically.

According to another embodiment, the invention concerns a method for manufacturing a memory device comprising the formation of an oxide layer between a first electrode and a second electrode. According to a preferred but not limiting embodiment of the invention, at least one of the two electrodes is a non-inert electrode, i.e. able to react with the oxide layer in such a way as to create oxygen vacancies or defects in said oxide layer when a voltage is applied to the device.

Advantageously, the formation of the oxide layer in such a way that the oxide layer has a first zone and a second zone, with the first zone surrounding or being located on either side of the second zone, with the minimum distance d2 separating the two electrodes on the second zone of the oxide layer being less than the minimum distance d1 separating the two electrodes on the first zone of the oxide layer.

This invention proposes a simple method, that makes it possible to release the constraints on the realization of contact at the top of the memory point (no expensive step of lithography), while still minimizing the formation zone of the conductive filament Another object of this invention relates to a microelectronic device that comprises a plurality of memory devices according to the invention. The term microelectronic device means any type of device carried out with microelectronic means. These devices encompass in particular in addition to devices with a purely electronic finality, micro-mechanical or electromechanical devices (MEMS, NEMS . . . )

as well as optical or optoelectronic devices (MOEMS . . . )

BRIEF DESCRIPTION OF THE FIGURES

Other characteristics, purposes and advantages of this invention will appear when reading the following detailed description, with respect to the annexed drawings, provided as non-limiting examples, and wherein.

Figure 1A:
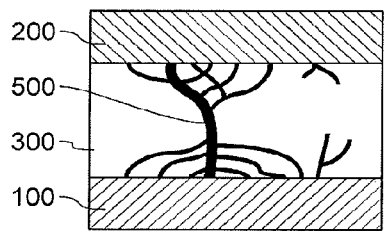
FIG. 1A shows a memory device comprising a metal-oxide layer arranged between two electrodes according to prior art. Conductive filaments are created through the oxide layer.
Figure 1B:
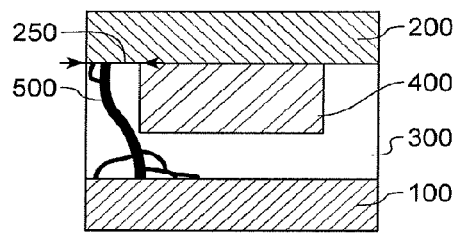
FIG. 1B shows a memory device comprising an oxide layer arranged between two electrodes according to prior art. The device shows a reduced contact surface between one of the electrodes and the oxide layer; with conductive filaments being formed between the electrodes and directed towards reduced contact surface.

The drawings are given as examples and are not limiting to the invention. They form diagrammatical block representations intended to facilitate the understanding of the invention and are not necessarily to scale of the applications practiced. More particularly, the relative thicknesses of the various layers and substrates may not be a representation of reality.

DETAILED DESCRIPTION

Before beginning a detailed review of the embodiments of the invention, hereinafter are announced optional characteristics that can possible be used in any combination or alternatively:

According to a particular embodiment, the oxide layer comprises a first oxide layer and a second oxide layer and the minimum distance d2 that separates the first and second electrodes on the second zone is equal to the thickness of the second oxide layer. The formation of the second zone is carried out in such a way that the minimum distance d2 that separates the first and second electrodes on the second zone is equal to the thickness of the second oxide layer. Particularly advantageously, this embodiment comprising a first oxide layer and a second oxide layer proposes a device where the first oxide layer is entirely removed in the thinned zone, before a second oxide layer of desired thickness d2 is deposited. As such, the oxide layer, i.e. the second oxide layer, of the thinned zone will be "intact" and no potentially modified on the surface by chemical etching used during the later steps of the method.

the ratio between the distance d2 and the distance d1 is comprised between 0.2 and 0.7, according to a particular embodiment carried using a stack comprising hafnium oxide (HfO2) as a metal oxide and titanium (Ti), of a thickness of 10 nm, as an active electrode (reservoir of oxygen).

the ratio between the surface of at least one electrode among the first and second electrodes located facing the second zone and the surface of at least one electrode among the first and second electrodes located facing the first zone is comprised between 0.0001 and 0.5. This ratio concerns, a particular embodiment carried out using a stack comprising a metal oxide with a base of hafnium oxide (HfO2) and of titanium (Ti), of a thickness of 10 nm, as an active electrode.

According to an embodiment, the first and second electrodes extend primarily in parallel planes. The second zone has flanks that extend perpendicularly to said planes.

According to an embodiment, at least one among the first and the second electrode extends primarily in a plane. The second zone is delimited by flanks that extend perpendicularly to said plane. As such, the surface of the second zone, taken in a plane parallel to that of the electrodes, is constant over the thickness of the device.

at least one electrode among the first and second electrodes is located in contact with the second zone at least in the second zone.

At least one of the first and second electrodes is a non-inert electrode able to react with the oxide layer in such a way as to create oxygen vacancies or defects in said oxide layer when a voltage is applied to the device.

the oxide layer is formed from a base of metal oxide or metal nitride, or from a two-layer stack. For example, as mentioned in patent Herner et al. U.S. patent application Ser. No. 11/395,995, "Nonvolatile Memory Cell Comprising a Diode and a Resistance-Switching Material," filed Mar. 31, 2006, $Ni_xO_y$, $Nb_xO_y$, $Ti_xO_y$, $Hf_xO_y$, $Al_xO_y$, $Mg_xO_y$, $Co_xO_y$, $Cr_xO_y$, $Zn_xO_y$, $Zr_xO_y$, $B_xN_y$, and $Al_xN_y$ show a variation in resistance according to the programming conditions ZrO2, $TaO_x$, HfxAlyOz can also be had.

the oxide layer is in direct contact with at least one electrode among the first and second electrodes on the second zone and one the first zone.

the oxide layer is in direct contact with at least one electrode among the first and second electrodes on the second zone and comprises at least one intermediate layer between the oxide layer and the at least one electrode among the first and second electrodes on the first zone.

the first zone and the second zone are contiguous. They are not separated by a layer or intermediate space.

Said at least one intermediate layer is a layer with a nitride base.

the distance d1 is comprised between 5 nanometers and 20 nanometers and preferably between 5 nanometers and 15 nanometers. These are particular advantageous cases with the example of the TiN/HfO2/Ti(10 nm)/TiN stack.

the distance d2 is comprised between 2 nanometers and 15 nanometers and preferably between 2 nanometers and 10 nanometers. These are particular advantageous cases with the example of the TiN/HfO2/Ti(10 nm)/TiN stack.

the distance d1 is comprised between 5 nanometers and 15 nanometers and the distance d2 is comprised between 2 nanometers and 10 nanometers. These are particular advantageous cases with the example of the TiN/HfO2/Ti(10 nm)/TiN stack.

the surface of at least one electrode from among the first and second electrodes located facing the first zone is comprised between 0.01 and 10 square micrometers. This remains particular advantageous with a particular case based on electrical data carried out using a TiN/HfO2/Ti(10 nm)/TiN stack.

the surface of at least one electrode from among the first and second electrodes located facing the second zone is comprised between 0.0001 and 0.25 square micrometers. This remains particular advantageous with a particular case based on electrical data carried out using a TiN/HfO2/Ti(10 nm)/TiN stack.

the distance d1 is comprised between 5 nanometers and 15 nanometers, the distance d2 is comprised between 2 nanometers and 10 nanometers. The surface of at least one electrode from among the first and second electrodes located facing the first zone is comprised between 0.01 and 10 square micrometers. The surface of at least one electrode from among the first and second electrodes located facing the second zone is comprised between 0.0001 and 0.25 square micrometers.

A prior step of locating the formation of at least one conductive filament in the second zone is carried out when a voltage is applied to the device according to the relative first and second distances d1, d2 and according to the surface of at least one electrode among the first and second electrodes located facing the first zone and according to the surface of at least one electrode among the first and second electrodes located facing the second zone. More precisely, the ratio between a first surface is taken into account which is the surface of at least one electrode among the first and second electrodes located facing the first zone and a second surface of this electrode located facing the second zone.

the step of locating comprises the determination of a ratio between the second distance d2 and the first distance d1, between 0.2 and 0.7 or between 0.5 and 0.85, in such a way that the conductive filament is formed in the second zone.

the step of locating comprises the determination of a ratio between on the one hand the surface via which at least one electrode among the first and second electrodes is located facing the first zone and on the other hand the surface via which this electrode is located facing the second zone, with the ratio being between 0.0001 and 0.5.

the formation of the second zone is carried out by a partial thinning of the oxide layer.

According to an embodiment of the method, the step of forming the oxide layer carried out in such a way that the oxide layer has a first zone and a second zone of an oxide layer comprises the following steps:

the formation, for example by depositing or by carry-over, of a oxide layer on an electrode among the first and second electrodes;

a step of thinning the oxide layer in such a way as to form the second zone;

with the method then comprising the deposit of the other electrode among the first and second electrodes on the first oxide layer.

Advantageously the thickness of the oxide layer, after the step of thinning and on the zone, has a thickness equal to the minimum distance d2. This method has for advantage to be particularly simple and reliable.

According to an embodiment of the method, the step of forming the oxide layer carried out in such a way that the oxide layer has a first zone and a second zone of an oxide layer comprises the following steps:

the formation, for example by depositing or by carry-over, of a first oxide layer on an electrode among the first and second electrodes;

the removal of all of the thickness of the first oxide layer only on the second zone in such a way as to expose said electrode from among the first and second electrodes on the second zone;

the formation, preferably via deposit, of a second oxide layer on the first oxide layer and on said electrode among the first and second electrodes exposed on the second zone;

with the method then comprising the deposit of the other electrode among the first and second electrodes.

Preferably, the thickness of the second layer such as deposited is equal to the minimum distance d2.

As such, the formation of the second zone is carried out in such a way that the minimum distance d2 that separates the first and second electrodes on the second zone is equal to the thickness of the second oxide layer. The distance d2 is therefore only controlled by the thickness of the deposit of the second layer. This thickness can as such be controlled very precisely.

Moreover, the two surfaces of the oxide layer on the second layer is intact. In particular, the face facing the other electrode was not damaged by etching. The performance of the device is improved.

The removal of the first layer on the second zone is for example carried out by lithography, by an electron beam for example.

All of these ranges of thicknesses, surfaces, ratios of thicknesses, ratios of surfaces, are particularly advantageous for a very particular embodiment, not limiting of the invention, comprising a stack of layers of the TiN/HfO2/Ti(10 nm)/TiN type. Other examples of a stack of layers are possible.

It is specified that within the scope of this invention, the term "on", does not necessarily mean "in contact with". Thus, for instance, depositing a layer on another layer does not necessarily mean that the two layers are directly in contact with each other, but this means that one of the layers at least partially covers the other by being either directly in contact therewith or by being separated therefrom by a film, another layer or another element.

The expression 'the zone of the element A is located "straight" or "facing" the element B' means that the zone of the element A and the element B are superimposed, in direct contact or not, according to a direction perpendicular to the main plane wherein the oxide layer extends. This direction corresponds to the vertical in FIGS. 3A to 4D in particular.

Figure 2A:
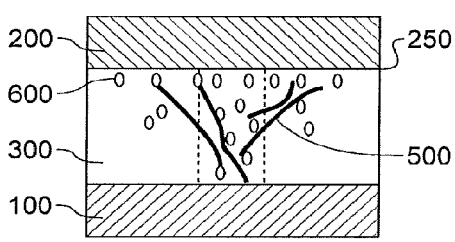
FIG. 2A shows an example of a memory device comprising an electrode, preferable non-inert, able to create oxygen vacancies or defects in the oxide layer using said non-inert electrode. Conductive filaments that are possibly formed are dispersed through the oxide layer.

FIG. 2A shows a memory device comprising an oxide layer 300 arranged between a first electrode 100 and a second electrode 200.

During the steps of programming, i.e. when a sufficient voltage and current are applied to the device, with a limitation in current that passes through the device, less, for example, than a few milliamperes, conductive filaments 500 can be selectively created and be broken between the electrodes 100, 200 through the oxide layer 300.

The device comprising a oxide layer 300 arranged between a first electrode 100 and a second electrode 200 is configured in such a way as to form defects 600 (for example metal atoms or vacancies 600 of oxygen) in the oxide layer 300. Preferably, one at least of the electrodes 100, 200 is able to react with the oxide layer 300. In the following description, this electrode 100, 200 will be designated as a non-inert electrode or active electrode. According to a preferred but non-limiting embodiment of the invention, the memory device according to this invention comprises at least one non-inert electrode, with the other electrode being by default, qualified as an inert electrode, i.e. that does not react with the oxide layer 300.

The invention extends indeed to the case where the two electrodes 100, 200 are non-inert or to the case where the two electrodes 100, 200 are inert.

It appears, in the example shown in FIG. 2A, that the conductive filaments 500 are formed through the zone of the oxide layer 300 provided with defects 600. When the contact surface 250 between at least one electrode 200, preferably non-inert, and the oxide layer 300, is substantial, the number of parasite paths of conductive filaments 500 that can be created during the steps of programming is high, which can generate, over time, substantial instability of the resistive memory devices.

Figure 2B:
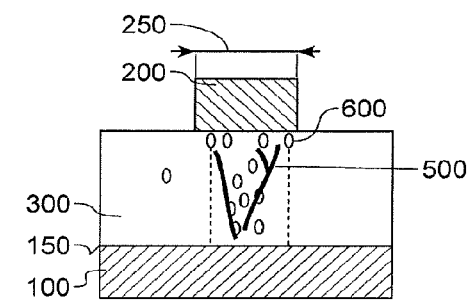
FIG. 2B shows an example of a memory device comprising an electrode, preferable non-inert, able to create oxygen vacancies or defects in the oxide layer using said non-inert electrode. The conductive filaments that are possibly formed are confined thanks to the reduction of the contact surface between an electrode and the oxide layer.

FIG. 2B shows a memory device obtained in the framework of the development of this invention, according to a particular embodiment. This device comprises a first electrode 100, preferably but not in a limiting manner, chosen as being inert and a second electrode 200, and a oxide layer 300 using said second electrode 200, preferably but not in a limiting manner chosen as non-inert. This device is able to create defects 600 in the oxide layer 300.

In this embodiment, the surface of the second electrode 200 was reduced in such a way as to reduce the contact surface 250 between said second electrode 200 and the oxide layer 300.

Advantageously, by decreasing the contact surface 250 between at least one electrode 100, 200 and the oxide layer 300, the number of parasite paths is less. The conductive filaments 500 that are possibly formed are confined thanks to the reduction of the contact surface 250 between the second electrode 200 and the oxide layer 300. The reduction in the number of parasite paths can advantageously make it possible to reduce the instability over time of the devices or reduce the variability in performance of such devices, following the confinement of the conductive filaments 500 in a limited zone.

The decrease in the contact surface 150, 250 can be done using the first electrode 100 and/or using the second electrode 200. According to an alternative example where in the reduction in the contact surface 150 is carried out using the first electrode 100, then the first electrode 100 will advantageously but not in a limiting manner chosen in such a way as to be non-inert i.e. able to react with the oxide layer 300 and the second electrode 200 with be chosen so as to be inert.

However, a disadvantage of such a memory device resides in the constrains for producing the electrode 100, 200 of which the surface is reduced. This further requires steps of lithography on a nanometric scale.

Forming electrodes 100, 200 of which the surface is reduced (for example, of about a square micrometer ($\mu m^2$), or even a hundred square nanometers ($nm^2$) requires in particular a step of depositing a metal layer that represents said electrode 100, 200 on the oxide layer 300, followed by a step of lithography via masking, a step of etching said electrode 100, 200 leaving in place only a portion of said electrode 100, 200 unexposed during the step of masking. The remaining portion of the electrode 100, 200 extends only over a small surface. As such, an additional disadvantage is linked to the difficulty of a realization of contact to be made with said remaining portion of the electrode 200 with reduced surface dimension (of about a square micrometer).

The memory device according to this invention comprises elements with micronic and/or nanometric dimensions. The description that follows has for preferred purpose to present a memory device and the manufacturing method thereof in reference to FIGS. 3A to 7C.

Figure 3A:
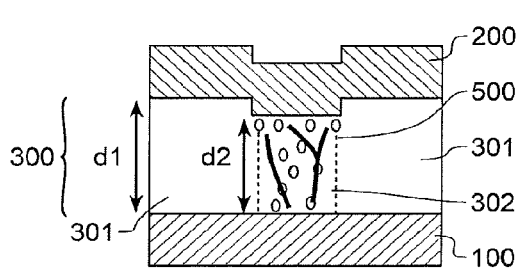
FIG. 3A shows a memory device, according to an embodiment of this invention, comprising a first region where the electrodes are separated by a distance d1 and second region where the electrodes are separated by a distance d2; the distance d2 being less than the distance d1, which makes it possible to confine the conductive filaments in the second region.

FIG. 3A shows a memory device according to a first embodiment comprising an oxide layer 300 arranged between a first electrode 100 and a second electrode 200. According to a preferred but non-limiting embodiment of the invention, the first electrode 100 is chosen in such a way as to be inert, i.e. configured to not react with the oxide layer 300. Preferentially, the first electrode 100 can be formed from a material, for example, with a Platinum, titanium nitride (TiN), or tantalum nitride (TaN) base. Advantageously but not in a limiting manner, the second electrode 200 is chosen in such a way as to be non-inert, i.e. configured to react with the oxide layer 300, by creating oxygen vacancies or defects 600 in said oxide layer 300. Preferentially, the second electrode 200 can be formed from a material with a titanium (Ti), tantalum (Ta), hafnium (Hf), zirconium (Zr) base, for example. The invention extends also to the case where the two electrodes 100, 200 are non-inert or to the case where the two electrodes 100, 200 are inert.

The oxide layer 300 is preferably chosen from among a metal oxide, for example with a hafnium oxide ($HfO_2$), titanium oxide ($TiO_2$), tantalum oxide ($Ta_2O_5$), Nickel oxide (NiO), Zinc oxide (ZnO) or two-layer base (for example of the Al2O3/HfO2 type).

A means for obtaining the confinement of the conductive filament, without having to substantially reduce the surface of at least one electrode 100, 200 of the memory device, which is difficult and expensive to carry out, is to locally refine, in a controlled manner, the thickness of the oxide layer 300 and more precisely to reduce the distance between the first and second electrodes 100, 200.

The memory device shown in FIG. 3A comprises at least one first zone 301 where the first and second electrodes 100, 200 are separated by a first distance d1. According to a non-limiting embodiment, this first distance d1 corresponds to the thickness of the oxide layer 300 initially deposited on one of the electrodes 100, 200. The distance d1, as the distance d2 described in what follows, are measured according to a direction perpendicular to the main plane wherein the oxide layer 300 extends. In the figures, this direction is vertical. The distance d1 corresponds to the shortest distance that separates the first and second electrodes 100, 200 in the first zone 301. The distance d2 corresponds to the shortest distance that separates the first and second electrodes 100, 200 in the second zone 302. At any point of the first zone 301, the distance that separates the first and second electrodes 100, 200 is less than or equal to the distance that separates the first and second electrodes 100, 200 in the second zone 302. The distance that separates the first and second electrodes 100, 200 can be equal to the distance that separates the first and second electrodes 100, 200 on the junction between the first 301 and second 302 zones is this junction is continuous. Outside of the junction between the first 301 and second 302 zones, the distance that separates the first and second electrodes 100, 200 is less than the distance separating the first and second electrodes 100, 200. Particularly advantageously, the memory device comprises a second zone 302 where the first and second electrodes 100, 200 are separated by a second distance d2. Advantageously, the second distance d2 is less than the first distance d1. Advantageously, the first zone 301 surrounds the second zone 302. The second zone 302 is as such located within a volume that is entirely occupied by the first zone 301. According to another embodiment, the first zone 301 is located on either side of the of the second zone 302. According to this embodiment, the second zone 302 forms for example a relief that extends mainly along a longitudinal direction and the first zone 301 forms for example two reliefs, each relief extending along a longitudinal direction and on one side of the relief of the second zone 302.

In the second zone 302 of the oxide layer 300, i.e. in the portion where the electrodes 100, 200 are at a reduced distance d2 from one another, the electric field passing through the second zone 302 will be more important than the one passing through the first zone 301.

The second electrode 200, preferably but not limiting chosen as non-inert, generates oxygen vacancies or defects 600 in the oxide layer 300. In the second zone 302 where the first and second electrodes 100, 200 are close together, the oxide layer 300 thinned with respect to the first zone 301, as such favoring the creation of conductive filaments 500 on said second zone 302 of the oxide layer 300.

Thanks to this predefined delimitation of a first zone 301 and of a second zone 302 in the oxide layer 300, it is possible to confine the conductive filaments 500 in a certain zone (which is the second zone 302) of said oxide layer 300 and to reduce, the dispersion of said conductive filaments 500 that can be responsible for the variability of the performance cycle after cycle.

Figure 3B:
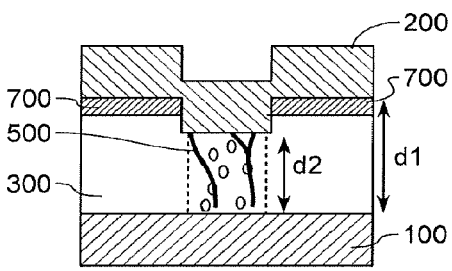
FIG. 3B shows a memory device, according to another embodiment of this invention, comprising a non-conductive intermediate layer between one of the electrodes and the oxide layer. The distance d2 is less than the distance d1, which makes it possible to confine the conductive filaments in the second region.

FIG. 3B shows a memory device according to a second embodiment comprising an oxide layer 300 arranged between a first electrode 100 and a second electrode 200. The memory device comprises a first zone 301 where the first and second electrodes 100, 200 are separated by a distance d1. In this embodiment, the distance d1 corresponds to the thickness of the oxide layer 300 initially deposited on one of the electrodes 100, 200 two which is added the thickness of an intermediate layer 700, preferably electrically insulating. Preferentially, the intermediate layer 700 is formed in such a way as to cover only the first zone 301 of the oxide layer 300. The intermediate layer 700 comprises an opening that makes it possible to thin via etching the oxide layer 300, then, the second electrode 200, to access the second zone 302 of the oxide layer 300. Preferentially, the intermediate layer 700 comprises an insulating material for example with a silicon oxide (SiO2), silicon nitride (SiN), silicon carbide (SiC) base. The thickness of the intermediate layer 700 is comprised between 5 nm and 100 nm, preferably about 20 nm. This thickness depends on the minimum thickness that can be deposited (according to the material). In the case where it is desired to minimize the lateral dimensions of the second zone 302, it is preferable to not have an aspect ratio between the height (corresponding to the thickness of material 700 remaining after etching) and the width of the "open" zone overhanging the zone d2 that is excessive, and this in order to have a good filling with the material 200.

The second distance d2 corresponds to the thickness of the oxide layer 300 initially deposited on one of the electrodes 100, 200 from which is subtracted the depth of the partial etching of the oxide layer 300 carried out by the opening of the intermediate layer 700. As such, the second distance d2 is less than the first distance d1. This generates an electric field in the second zone 302 of the oxide layer 300 that is greater than that in the first zone 301.

This second embodiment advantageously makes it possible to confine the conductive filament 500 in the zone where the electric field will be greater, i.e. in the second zone 302 of the oxide layer 300.

Figure 4A:
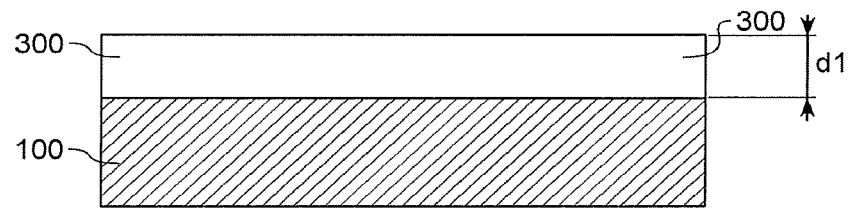
FIGS. 4A to 4D show the steps of an example of a manufacturing method of the memory device shown in FIG. 3A according to this invention.
Figure 4B:
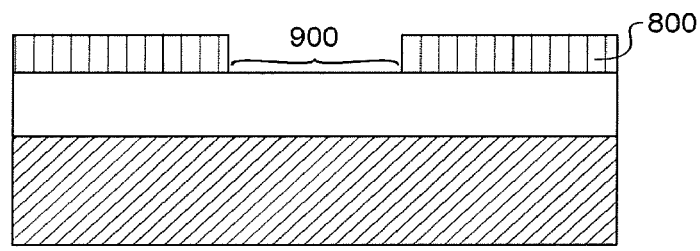
Figure 4C:
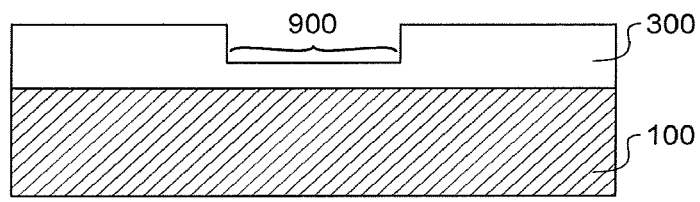
Figure 4D:
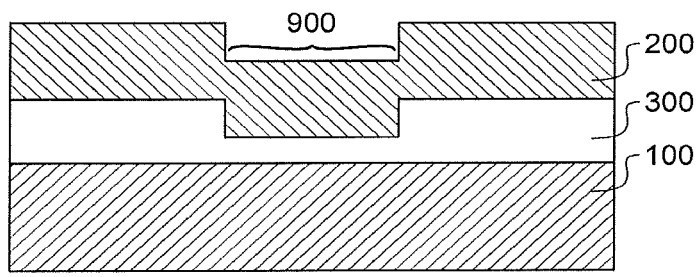

FIGS. 4A to 4O show the steps of carrying out the memory device shown in FIG. 3A according to this invention.

A first step (FIG. 4A) consists in the forming of a first electrode 100, followed by the forming of an oxide layer 300 comprising a first zone 301 of a distance d1, corresponding to the thickness of the oxide layer 300 deposited.

Then follows a step of lithography (FIG. 4B), preferably a lithography via electron beam or electronic lithography, intended to define patterns 900 in the oxide layer 300; said patterns able to have a surface of about a square micrometer, and advantageously of about a hundred square nanometers. With respect to photolithography, the advantage of this technique of lithography via electron beam is that it makes it possible to push the limits of optical lithography and to draw patterns 900 with a resolution that can range up to dimensions of decananometers. In order to carry out patterns of low surface dimension, a layer of negative resin 800 is preferably used during the electronic lithography. The term "negative" resin means a type of photosensitive resin for which the portion exposed to light becomes insoluble to the developer and where the portion of photosensitive resin, not exposed, remains soluble. According to other embodiments, the pattern 900 will be formed by an optical photolithographic technique or extreme technique of the ultra-violet (UV) type or by nano-imprinting.

After the step of lithography, a step of partial etching (i.e. a thinning) of the oxide layer 300 (FIG. 4C) is carried out in order to form at least one pattern 900 in the oxide layer 300, by transfer of the pattern 900 formed beforehand in the layer of resin 800. The term partial etching means an etching configured in such a way as to remove only a portion of the thickness of the etched layer. They layer of resin 800 formed beforehand will make it possible to protect the zones of the oxide layer 300 that will not have been etched or that have to be etched to a lesser degree. The etching of the oxide layer 300 is preferentially anisotropic. The etching is, for example, carried out by plasma etching or by wet etching. The remaining layer of resin 800 is then removed.

The second electrode 200 is then carried out by depositing a layer, preferably metal, on the entire surface of the oxide layer 300. Preferably, the deposit is compliant.

Advantageously, for this type of memory device, the realization of contact on each one of the first and second electrodes 100, 200 is facilitated since the electrodes 100, 200 retain wide surfaces.

Figure 5B:
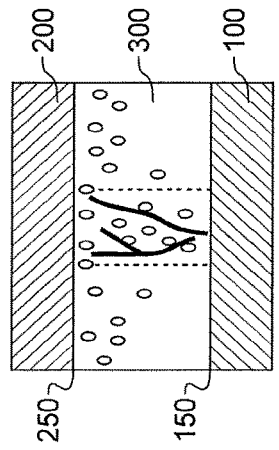
FIG. 5B is an illustration of the memory device used to carry out the graph of FIG. 5A.
Figure 5A:
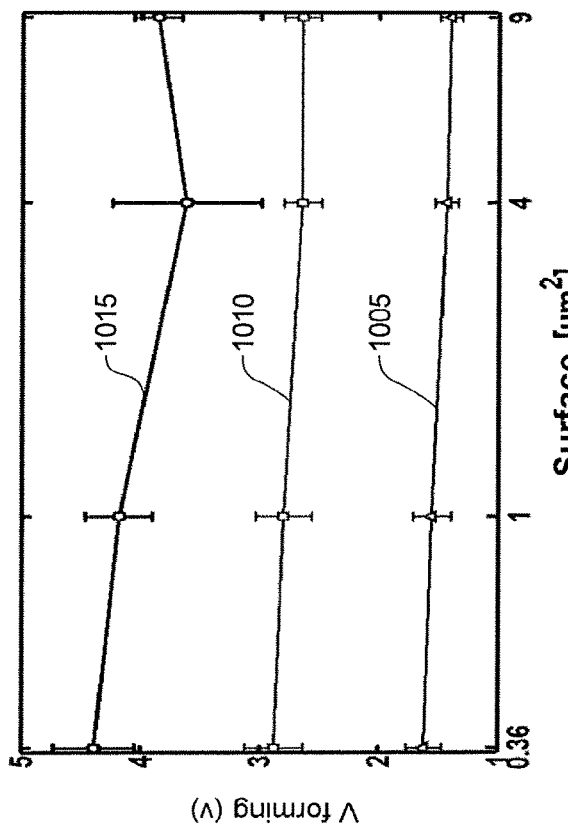
FIG. 5A shows a graph that shows the forming voltage (i.e. the voltage required to have a first formation of the conductive filament) for different thicknesses of the oxide layer of the HfO2 type, according to the surface of the device.

FIG. 5A shows a graph that represents the forming voltage for different thicknesses of the oxide layer 300 according to the surface of the devices. The term "forming" voltage, designated in what follows as $V_{FORMING}$, means the difference in potential that must be applied between the two electrodes 100, 200 in order to provoke a breakdown in the insulating capacity of the oxide layer 300, assimilated as such to a condition of low resistance of the memory device. This breakdown corresponds to the formation of a path or of a conductive filament within the oxide layer 300 and which connects the two electrodes 100, 200. More generally, $V_{FORMING}$ is the minimum voltage amplitude that has to be applied to the terminals of the cell in order to make it conductive or in order to render it substantially more conductive than in the highly resistive state.

The voltage $V_{FORMING}$ is the minimum voltage to be applied to the device in order to switch from a first resistive state ("HRS" for "High Resistive State") to a second resistive state ("LRS" for "Low Resistive State"). The device in the LRS state has a resistance that is lower, preferably two times, and preferably ten times, and preferably one hundred times, than the resistance of the device in the HRS state.

In a memory device, it is advantageous to obtain a low forming voltage $V_{FORMING}$.

FIG. 5B is an illustration of the memory device used to carry out the graph of FIG. 5A. The memory device used comprises an oxide layer 300 arranged between a first electrode 100 and a second electrode 200. According to this example, an oxide layer 300 is chosen with a hafnium oxide ($HfO_2$) base.

The graph in FIG. 5A compares the voltages $V_{FORMING}$ obtained relatively to the predefined thicknesses of the oxide layer 300.

The curve 1005 shows a memory device of which the oxide layer 300 is about 5 nanometers (nm). The curve 1010 shows a memory device of which the oxide layer 300 is about 10 nanometers. The curve 1015 shows a memory device of which the oxide layer 300 is about 15 nanometers. It clearly appears that the voltage $V_{FORMING}$ increases with the thickness of the oxide layer 300.

As such, the shorter distance separating the first electrode 100 and the second electrode 200 is (for example 5 nm, curve 1005), the lower the voltage $V_{FORMING}$ is. It therefore seems preferable to reduce the distance that separates the first electrode 100 from the second electrode 200, in order to obtain a low voltage $V_{FORMING}$.

Moreover, such as is shown in FIG. 5A, it is established that, the larger the surface of the memory device (this means here the surface dimension of the second electrode 200) is, the lower the voltage $V_{FORMING}$ is (see the change in the curves 1005, 1010, 1015 according to the surface of the devices). In order to obtain a low voltage $V_{FORMING}$, a compromise would be to reduce the distance between the electrodes 100, 200, while still increasing the contact surface between the second electrode 200 and the oxide layer 300.

Figure 6B:
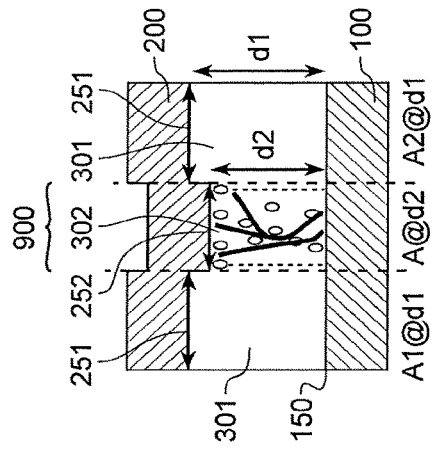
FIG. 6B is an illustration of the memory device used to explain the graph of FIG. 6A.
Figure 6A:
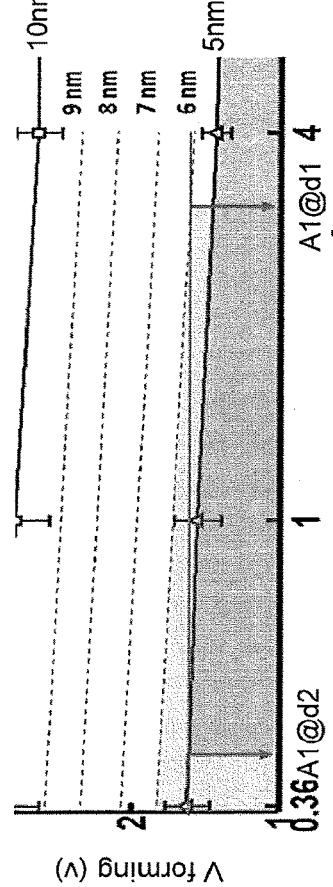
FIG. 6A is an enlargement of FIG. 5A.

FIG. 6A is an enlargement of FIG. 5A, showing an extrapolation of the results obtained hereinabove. FIG. 6B is an illustration of the memory device used to explain the graph of FIG. 6A. The memory device of FIG. 6B comprises an oxide layer 300 arranged between a first electrode 100 and a second electrode 200. In a first zone 301, the electrodes 100, 200 are separated by a distance d1. In a second zone 302, the electrodes 100, 200 are separated by a distance d2. Advantageously, the first zone 301 surrounds the second zone 302. According to another embodiment, the first zone 301 is located on either side of the of the second zone 302. Preferentially, the distance d2 is less than the distance d1.

The global voltage $V_{FORMING}$ of the device shown in FIG. 6B is that obtained by the lowest voltage between:
- the voltage $V_{FORMING}$ associated with the first zone 301 wherein the electrodes 100, 200 are separated according to the distance d1 (corresponding to the surfaces A1 and A2 of contact 251 between the first zone 301 of the oxide layer 300 and the second electrode 200; said surfaces being designated A1@d1, A2@d1).
- the voltage $V_{FORMING}$ associated with the second zone 302 wherein the electrodes 100, 200 are separated according to the distance d2 (corresponding to the surface A of contact 252 between the first zone 302 of the oxide layer 300 and the second electrode 200; said surface being designated A@d2).

FIG. 6A shows the results of a step of locating defining an optimized ratio of the contact surfaces 251, 252 between, on the one hand, the second electrode 200 and the first zone 301 and, on the other hand, the second electrode 200 and the second zone 302; with this ratio making it possible to favor the formation of the conductive filament 500, inside the second zone 302, rather than on the first zone 301.

To do this, during a first step, a measurement is taken of the voltage $V_{FORMING}$ for different contact surfaces and different thicknesses of the oxide layer 300 such as shown in FIG. 5A. It is then possible to carry out an extrapolation in order to obtain a behavior according to different intermediate thicknesses of the oxide layer 300 between nm and 10 nm, for example for thicknesses of the oxide layer 300 of about 6 nm, 7 nm, 8 nm, 9 nm.

According to a particular embodiment, a common voltage $V_{FORMING}$ is chosen between two thicknesses, for example a voltage $V_{FORMING}$ of about 1.8V for thicknesses (more precisely for distances separating the electrodes 100, 200) for example of 5 nm for the distance d2 and 6 nm for the distance d1.

In order to ensure a lower voltage $V_{FORMING}$ in the second zone 302, i.e. in the zone chosen for confining the conductive filaments 500, than in the first zone 301, a minimum contact surface A@d2 is determined. For the same value of the second distance d2, a contact surface (i.e. the surface of the pattern 900 formed in the oxide layer 300) is chosen between the second electrode 200 and the oxide layer 300 that is higher than the minimum contact surface A@d2, in such a way that the voltage $V_{FORMING}$ for said surface is necessarily lower than that of the minimum surface. For example, in the example shown in FIG. 6A, for the second zone 302 that has a distance d2 (equal to 5 nm for example), a contact surface greater than or equal to 0.4 µm² is chosen. In the same way, a surface A@d1 is chosen below which the voltage $V_{FORMING}$ will be necessarily higher than that deduced for the second zone 302 of the oxide layer 300. For example, in the example shown in FIG. 6A, for the first zone 301 that has a distance d1 (equal to 6 nm for example), a contact surface less than or equal to 3.5 µm² is chosen.

As such, it will be assured that for a voltage of 1.8 V applied to the terminals of the electrodes 100, 200, the conductive filaments 500 are confined in the second zone 302.

In order to reduce the variability as much as possible, it is sought to use the smallest surface possible for A@d2, in the second zone 302.

Figure 7A:
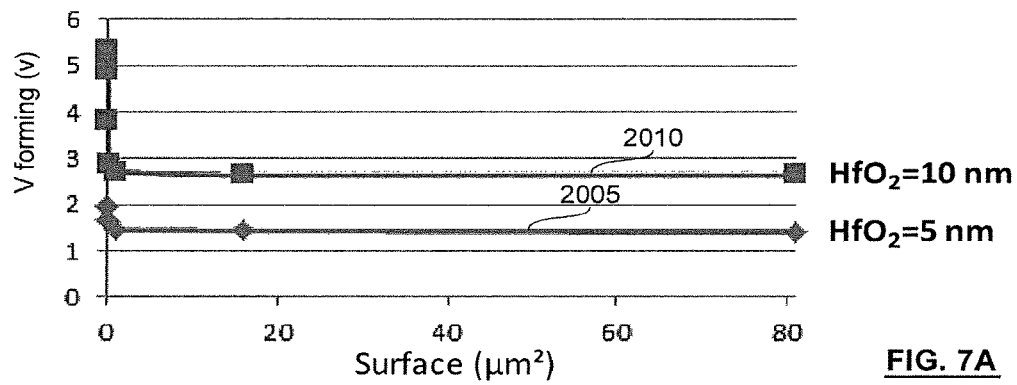
FIGS. 7A to 7C show graphs that represent a voltage according to the surface of the memory device, for different thicknesses of the oxide layer.
Figure 7B:
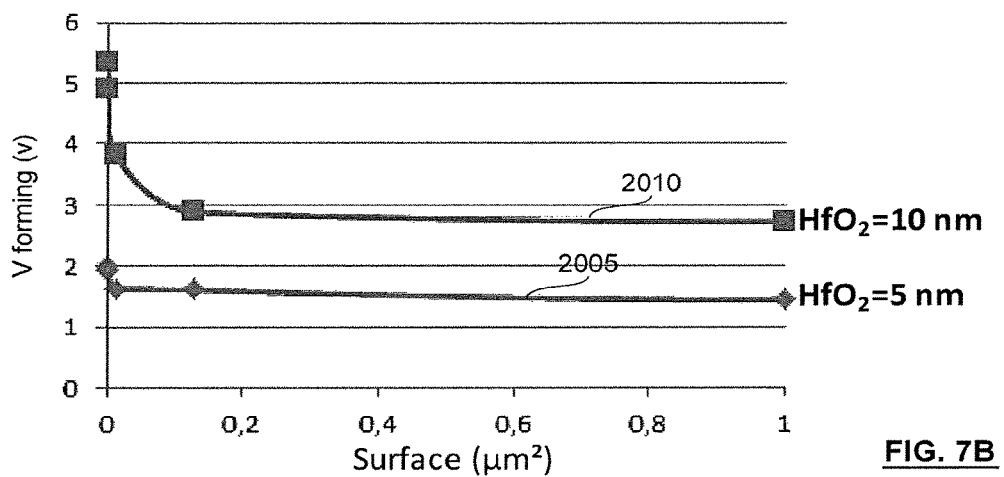
Figure 7C:
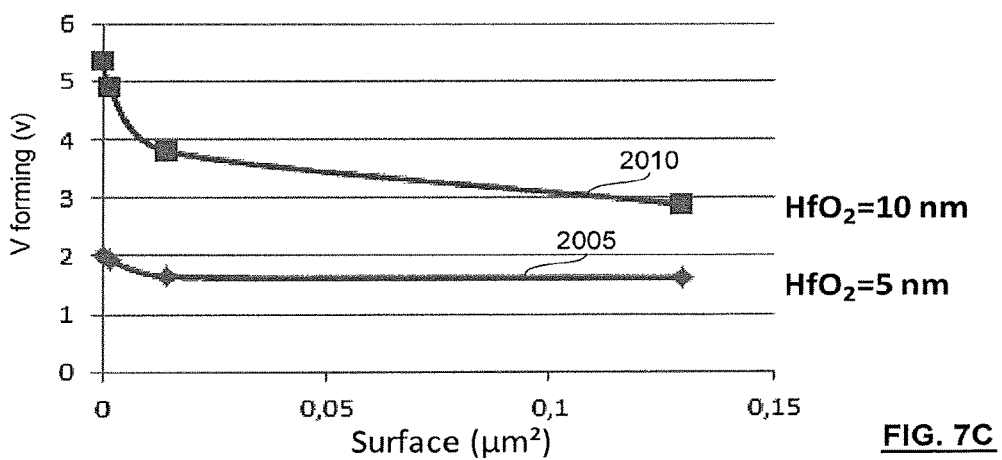

FIGS. 7A to 7C show graphs that represent the voltage $V_{FORMING}$ according to the contact surface of the memory device, for different thicknesses of the oxide layer 300. FIG. 7A makes it possible to estimate a voltage $V_{FORMING}$ according to the contact surface, for surfaces ranging from 0.0001 µm² to 80 µm². This comes from experimental data obtained for surfaces ranging from 0.36 µm² to 96 µm² on a stack of layers comprising a first electrode 100 for example with a titanium nitride (TiN) base, an oxide layer 300 for example with a hafnium oxide (HfO₂) base and a second electrode 200 for example with a titanium/titanium nitride base. For smaller surfaces, the voltages $V_{FORMING}$ are extracted using experiments conducted on a stack of layers comprising, according to a non-limiting example of the invention, a first electrode 100 with a TiN base, an oxide layer 300 with a HfO₂ base, a second electrode with a Hf/TiN base, for different thicknesses of the oxide layer 300. The curve 2005 shows a memory device of which the oxide layer 300 is about 5 nanometers. The curve 2010 shows a memory device of which the oxide layer 300 is about 10 nanometers.

The graphs in FIGS. 7A to 7C clearly show a behavior of the voltage $V_{FORMING}$ of the exponential type in particular for surfaces less than 1 µm².

According to the FIGS. 7B and 7C, it appears that for very small surfaces (less than 0.1 µm²), the voltage $V_{FORMING}$ no longer increases linearly, but more exponentially.

According to an embodiment, for the case of an oxide layer 300, for example with a HfO₂ base, of a thickness of about 10 nm, for a surface of 40 nm×40 nm, i.e. 0.0016 µm², the voltage $V_{FORMING}$ is comprised between 4.3 V and 6 V, while it is comprised between 2 V and 3.8 V for a surface of 120 nm×120 nm, i.e. about 0.014 µm² (9 times greater).

For the second zone 302 of the oxide layer 300, the contact surface is preferentially chosen less than 0.01 µm² (i.e. 100 nm×100 nm). For the first zone 301, the surfaces are for example carried out with optical lithography techniques with non-aggressive dimensions, typically between 0.04 µm² and a few square micrometers. As shown in FIGS. 7B and 7C, for an oxide layer 300, for example with a HfO₂ base, of a thickness of about 10 nm and surfaces of about 0.04 µm², the voltage $V_{FORMING}$ required is greater than 3V and preferable about 3.5V. For an oxide layer 300 of which the second zone 302 has a thickness of HfO₂ of 5 nm and a surface less than 0.01 µm², the voltage $V_{FORMING}$ required is about 2 V.

However, as the instability over time of the resistive states observed in the memory device is rather substantial, it needs to be taken into account for the dimensioning of the second zone 302 of the oxide layer 300.

As such, according to an example, the maximum voltage $V_{FORMING}$ obtained for a thickness of HfO₂ of 5 nm is about 2.55 V for a surface of 0.0001 µm² (10 nm*10 nm). The minimum voltage $V_{FORMING}$ obtained for a thickness of HfO₂ of 10 nm and for a surface of 1 µm² is about 2.2 V. In this configuration, if a distance d1 of about 10 nm is chosen for the first zone 301 with a contact surface of 1 µm² and a distance d2 of about nm for the second zone 302 with a contact surface of 0.0001 µm², the voltages $V_{FORMING}$ in each one of the first and second zones 301, 302 being relatively close, there is a risk of forming a conductive filament 500 in the first zone 301.

In order to avoid this problem as much as possible, there are two possibilities considered in the framework of the development of this invention. A first possibility consists in retained the same relationship (or ratio) of thicknesses d2/d1 (or relative distances between the electrodes 100, 200) and to ensure working with contact surfaces that make it possible to have a voltage $V_{FORMING}$ in the first zone 301, greater than the maximum voltage $V_{FORMING}$, to which is added for example a voltage value of 1 V, in the second zone 302. According to an embodiment, a voltage $V_{FORMING}$ in the first zone 301 is chosen greater than about 3.5 V, which induces restraining the choice of contact surfaces to a surface less than or equal to 0.04 µm², i.e. about less than 200 nm×200 nm. In this method of configuration, there are only a few choices of contact surfaces for the first zone 301.

A second possibility is to work with a distance d1 between the electrodes 100, 200 (or a thickness of the oxide layer 300) in the first zone 301 that is notably greater than the distance d2 in the second zone 302, especially if it is desired to form wider contact surfaces. As such, according to an embodiment, with a thickness of the oxide layer 300, for example of $HfO_2$, of 15 nm, the voltage $V_{FORMING}$ is one the average greater than 3.8V, even when integrating an error bar (representing the variability over the voltage $V_{FORMING}$) of 1V. The minimum voltage $V_{FORMING}$ obtained would be 3.3V, which makes it possible to guarantee that the conductive filament 500 would not be formed in the first zone 301, but in the second zone 302 where the voltage $V_{FORMING}$ will be not as high. In this method of configuration, there is a wide choice of contact surfaces.

According to an embodiment, the curves of voltage $V_{FORMING}$ are plotted according to the various thicknesses of oxide. The pair (d1, d2) is fixed.

According to a preferred embodiment, the distance d1 is defined corresponding to a first minimum voltage $V_{FORMING}$ for a surface A1 greater than or equal to 5 µm² and the distance d2 corresponding to a second maximum voltage $V_{FORMING}$ (for a surface A2 greater than or equal to 100 nm²). The surface A1 is the lower limit of the surface beyond which the forming voltage $V_{FORMING}$ changes very little (asymptotic lower limit). The surface A2 corresponds to minimum memory point manufacturing surfaces of 10×10 nm². The first minimum forming voltage is obtained for the pair (d1, A1). The second maximum forming voltage is obtained for the pair (d2, A2). The first minimum forming voltage and the second maximum forming voltage make it possible to take into account the variability over the forming voltages, $V_{FORMING}$; with a sampling of 50 devices, for example. The difference between the first minimum forming voltage and the second maximum forming voltage must be greater than or equal to 1V (volt).

The curves of FIGS. 5A and 7C are shown for a stack of TiN (35 nm)/HfO2/Ti (10 nm) TiN. FIG. 5A shows the forming voltages according to the surfaces for different thicknesses of HfO2 (5, 10 and 15 nm). The curve in FIG. 7C (zoom of the curves of FIGS. 7A and 7B) shows that the pair (d1=10 nm, d2=5 nm) cannot be retained because the criterion of the difference between the first minimum forming voltage and the second maximum forming voltage which has to be greater than or equal to 1V is not respected.

On the other hand, for a thickness of HfO2 of 15 nm, the voltage VF1 is greater than or equal to 3.5V for a surface A1 greater than or equal to 5 µm².

For the pair (d1=15 nm, d2=5 nm), the criterion of the difference between the first minimum forming voltage and the second maximum forming voltage which has to be greater than or equal to 1V is respected (see curves 5A and 7C). The pair (d1=13 nm, d2=5 nm), can potentially be retained if the difference between the first minimum forming voltage and the second maximum forming voltage is greater than or equal to 1V.

Alternatively, using a thickness pair (d1, d2), the surfaces A1, A2 can be determined for which the criterion of the difference between the first minimum forming voltage and the second maximum forming voltage which has to be greater than or equal to 1V is respected.

Figure 8A:
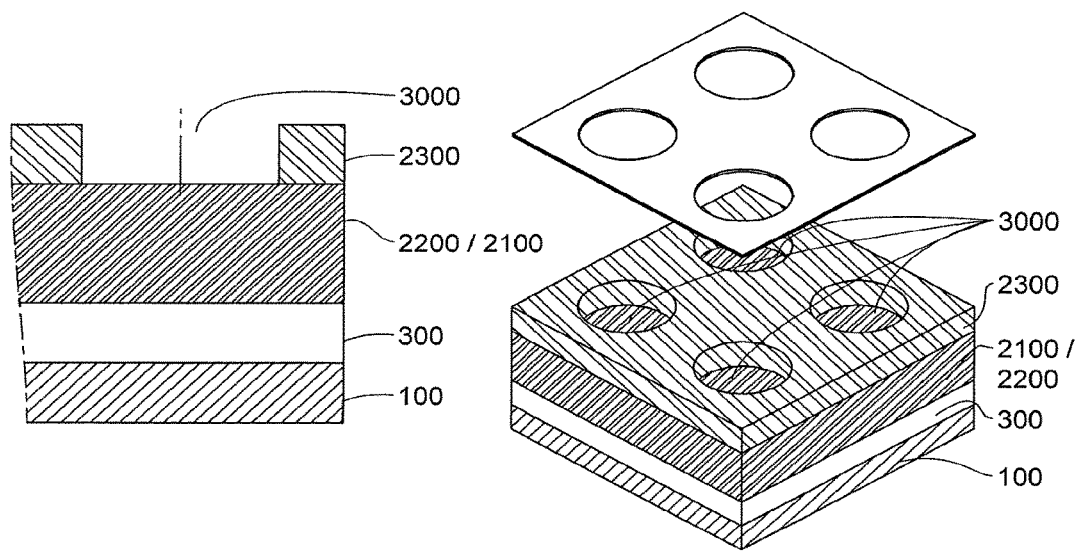
FIGS. 8A to 8F show an embodiment of a localized thinned zone of the oxide by using lithography referred to as "DSA" (acronym for "Direct Self Aligned") using copolymers of the diblock type.
Figure 8B:
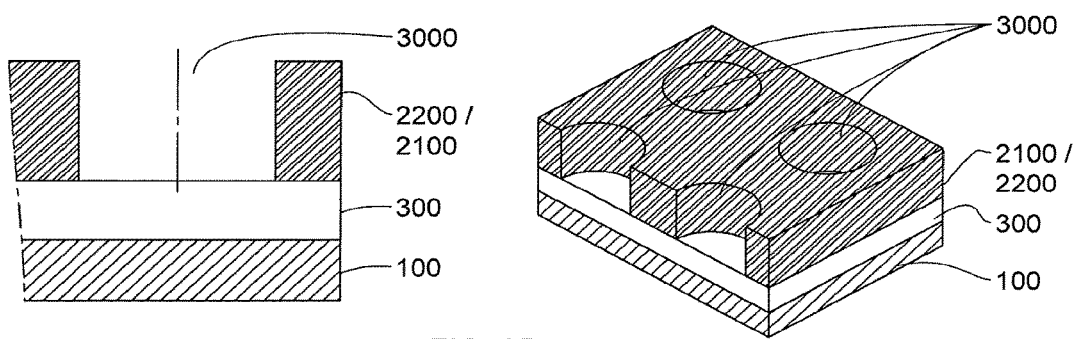
Figure 8C:
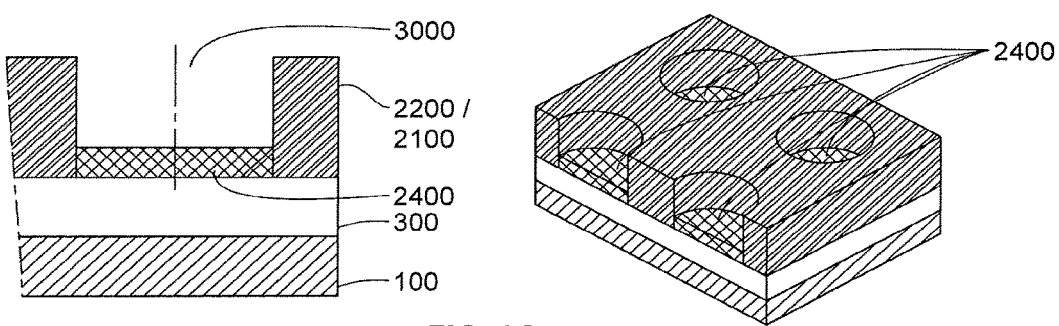

FIGS. 8A to 8F show an embodiment of a localized thinned zone of the oxide by using lithography referred to as "DSA" (acronym for "Direct Self Aligned") using copolymers of the diblock type. FIGS. 8A to 8C show the formation of guiding patterns 3000. Beforehand, a first electrode 100 is formed.

According to an embodiment, the first electrode 100 has a titanium nitride (TiN) base, a thickness of 35 nm, formed by physical vapor deposition (PVD). Then a oxide layer 300 is formed, for example by using atomic layer deposition (ALD), at a temperature preferably in the vicinity of 300° C., of a thickness of 10 nm. According to an example, the oxide layer 300 has a hafnium oxide (HfO2) base. Then follows a step of forming a stack comprising, successively starting with the oxide layer 300, a layer of SOC 2100 (Spin on Carbon) and preferably an additional layer for example a layer of SiARC 2200 (Silicon Anti Reflective Coating), of a thickness of 20 nm, for example.

A first step shown in FIG. 8A is the imprinting of guiding patterns 3000 in a layer of resin 2300, deposited beforehand on the layer of SiARC 2200, preferably photosensitive, by the bias of a lithography, for example, extreme Ultra-Violet (EUV) or e-beam or any other lithography technique (known under the terms "nano-imprint", "soft-lithography", "multi-patterning", etc.).

These guiding patterns 3000 are then transferred in the underlying stack of masks constituted, according to an embodiment, of a layer of SiARC 2200 (Silicon Anti Reflective Coating) and of a layer of SOC 2100 (Spin on Carbon), such as shown in FIG. 8B. This stack 2100, 2200, comprising the layer of SiARC 2200 and the layer of SOC 2100, is advantageous in particular for adapting the refractive index during an exposure. This integration is preferred in the framework of this invention. However, it is also possible to directly use the layer of resin 2300 as guiding patterns 3000 or other hard masks than the stack of SiARC 2200/SOC 2100, such as for example titanium nitride (TiN), silicon nitride (SiN), silicon oxide (SiO2), boron nitride (BN), resin hardened by the deposit of a hard mask. The guiding patterns 3000 carried out can be of different shapes (for example of circular, elliptical or other shape) and different pitches. The height of the guiding patterns 3000 (or surface topography) measured will be for example 130 nanometers regardless of the density of said guiding patterns 3000.

Once the guiding patterns 3000 are created, the substrate is neutralized, i.e. the underlying oxide layer 300 by grafting therein a neutralization layer 2400 (FIG. 8C). The thickness of the neutralization layer 2400 can, for example, be of about ten nanometers thick, preferably about 10 nm. The neutralization layer 2400 can be formed in a statistic copolymer, according to a preferred example of PS-r-PMMA (for poly (styrene-b-methyl methacrylate)), or a homopolymer (for example, polystyrene). The grafting of this neutralization layer 2400 is done, preferably, in three successive steps: a deposit via spin-coating, an annealing and a rinsing. This step is advantageous so that the cylinders of the diblock copolymers are oriented vertically with respect to the surface inside the guiding patterns 3000, during the organization annealing.

Figure 8D:
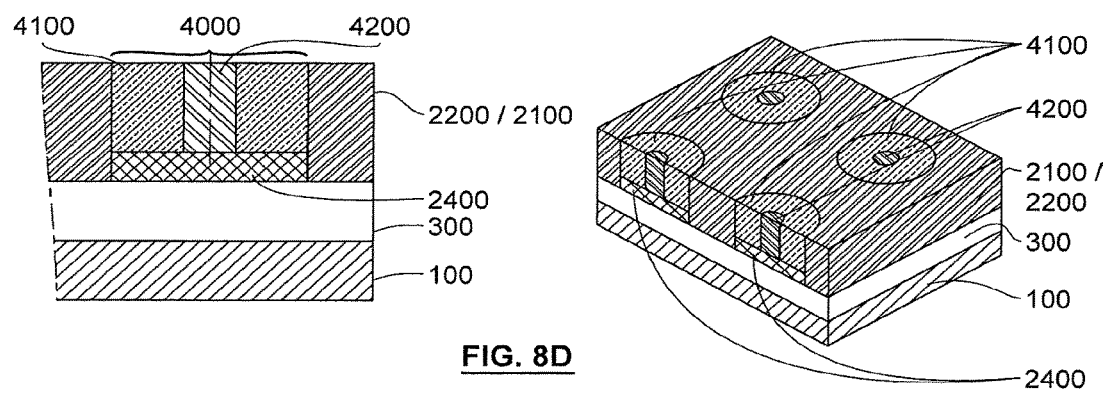

After the steps of forming guiding patterns 3000, there is a step of self-assembly of the diblock copolymers 4000, such as shown in FIG. 8D. The diblock copolymers 4000 can be, according to a preferred example, PS-b-PMMA (for poly (styrene-b-methyl methacrylate)) comprising a first polymer, polystyrene PS 4100 and a second polymer, polymethyl methacrylate PMMA 4200. The deposit of diblock copolymers 4000 is done, for example, via spin coating. As such, the parameters, during the depositing of the diblock copolymers 4000 by the spin coating technique (the speed of rotation (for example: 1500 rpm), the concentration of the solution (for example 1.5%), the duration of rotation, the density of the polymer) must be carefully chosen in order to allow for a controlled thickness inside the guiding patterns 3000. The step of spin coating will be followed by a step of thermal annealing (for example carried out at a temperature of 250° C. for 5 min under nitrogen (N2)), allowing for the self-organization of the diblock copolymers 4000.

Figure 8E:
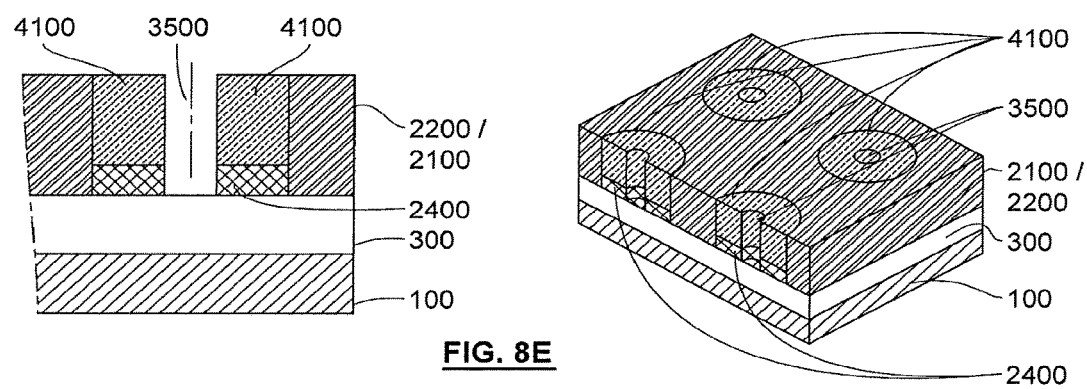

FIG. 8E shows the realization of a hollow pattern, such as a hole 3500 in the matrix of the first polymer 4100 with a polystyrene PS base of the guiding patterns 3000. The second polymer 4200 with a polymethyl methacrylate base is selectively removed with respect to the first polymer 4100 with a polystyrene base and with respect to the stack comprising the layer of SiARC 2200 and the layer of SOC 2100. The removal of the second polymer 4200 is carried out, for example, using acetic acid. Then, the neutralization layer 2400 is etched through holes 3500 of the matrix of the first polymer 4100.

Figure 8F:
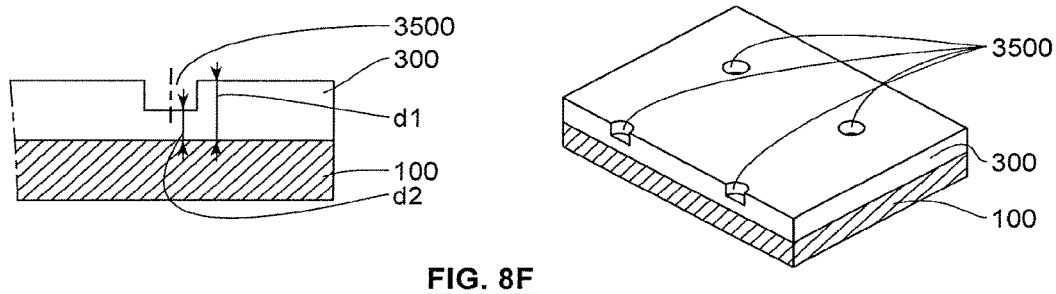

FIG. 8F shows the transfer of hollow patterns, such as holes 3500 in the underlying oxide layer 300. The patterns of the holes 3500 formed in the first polymer 4100 are partially transferred in the oxide layer 300. To do this, an etching is carried out of the oxide layer 300, for example with a HfO2 base. In the embodiment shown this etching is partial. It then has for example an etching over a thickness of 5 nm, using a chemistry comprising BCl3/Cl2 for example.

According to another embodiment not shown and which will be described in more detail in what follows an etching of the oxide layer 300 is carried out over all of its thickness straight with the patterns of the holes 3500.

Then removal is carried out of the first polymer PS 4100, of the neutralization layer 2400, of the layer of SiARC 2200 and of the layer of SOC 2100 in such a way as to leave in place the oxide layer provided with a thinned zone comprising a thickness d2; the thickness d2 being less than the thickness d1 of the oxide layer 300, initially deposited. Finally, a second electrode 200 (not shown) is formed in the form of a two-layer of titanium of a thickness of 10 nm and of titanium nitride of a thickness of 50 nm.

According to another alternative embodiment relatively to FIGS. 8A to 8F, a first oxide layer, for example with a HfO2 base, is formed on the first electrode 100. The first oxide layer comprises a thickness e1. Then the same steps as those shown in FIGS. 8A to 8E are carried out, with the first oxide layer replacing the oxide layer 300. The transfer of holes 3500 in the underlying oxide layer 300 is then carried out. The patterns of the holes 3500 formed in the first polymer 4100 are transferred in the oxide layer 300. Contrary to what is shown in FIG. 8F, a total etching (not partial) is carried out of the entire thickness e1 of the first oxide layer in such a way as to reach the first electrode 100 on the patterns of the holes 3500. The first oxide layer is therefore exposed on a zone intended to define the second zone 302.

Then removal is carried out of the first polymer PS 4100, of the neutralization layer 2400, of the layer of SiARC 2200 and of the layer of SOC 2100 in such a way as to leave in place the first oxide layer provided with a zone opening onto the first electrode 100. Then the second oxide layer, for example with a HfO2 base, is formed in such a way as to cover the first oxide layer. The second oxide layer comprises a thickness d2. The second oxide layer is then covered by a second electrode 200. As such, in a first zone 301, the electrodes 100, 200 are separated by a distance d1, corresponding to the sum of the thickness e1 of the first oxide layer and of the thickness d2 of the second oxide layer. In a second zone 302, the electrodes 100, 200 are separated by a distance d2, corresponding to the thickness d2 of the second oxide layer. Advantageously, the first zone 301 surrounds the second zone 302. According to another embodiment, the first zone 301 is located on either side of the of the second zone 302. Advantageously, the distance d2 is less than the distance d1.

Particularly advantageously, the preceding embodiment comprising a first oxide layer and a second oxide layer proposes a device where the first oxide layer is entirely removed in the thinned zone 302, before a second oxide layer of desired thickness d2 is deposited. As such, the oxide layer, i.e. the second oxide layer, of the thinned zone 302 will be "intact" and no potentially modified on the surface by chemical etching used during the later steps of the method.

Another embodiment of a device according to the invention shall now be described in reference to FIGS. 9A to 9D.

Figure 9A:
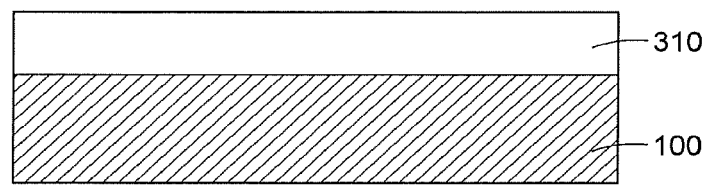
FIGS. 9A to 9D show another embodiment of a memory device according to the invention.
Figure 9B:
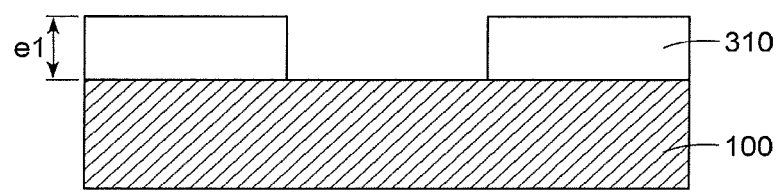

According to this alternative embodiment, a first oxide layer 310, for example with a HfO2 base, is formed on the first electrode 100 for example by depositing or by carry-over (FIG. 9A). The first oxide layer 310 has a thickness e1. This layer 310 is preferably compliant.

A step of removing (FIG. 9B) is then carried out of all of the thickness of the first layer 310 in a zone intended to form the second zone 302.

This removal can be carried out by a step of lithography, for example by electron beam or by the deposit of a mask then insulation and etching. This removal forms a pattern 900 in the first layer 310. With this removal being carried out over the entire thickness e1 of the first oxide layer 310, the pattern 900 is opening onto the first electrode 100. The latter is therefore exposed on the second zone 302. Outside of the first zone, the first oxide layer 310 is etched or not etched to a much lesser degree so as to continue to cover the electrode 100.

The layers of oxide 310 and 320 as such form the oxide layer 300.

Figure 9C:
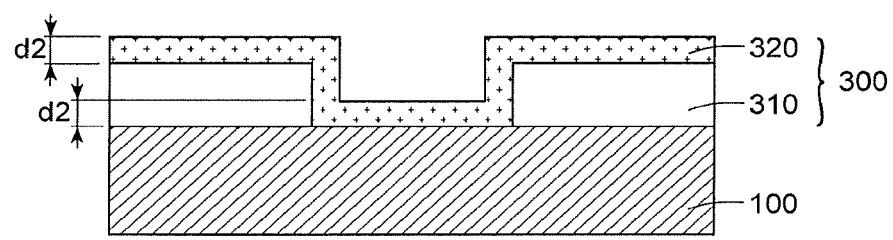
Figure 9D:
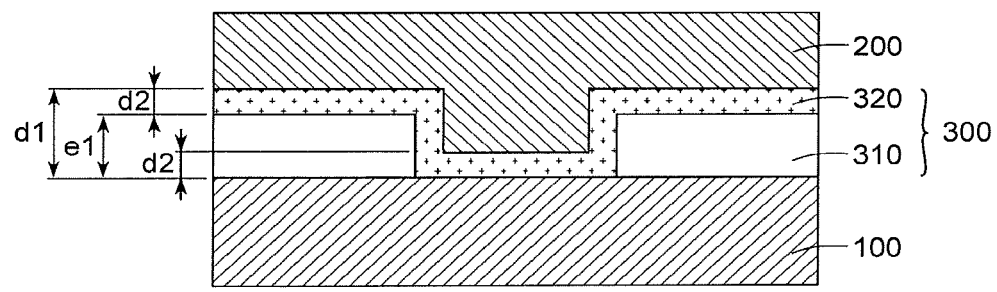

Then the second oxide layer 320, for example with a HfO2 base, is formed in such a way as to cover the first oxide layer 310 (FIG. 9C). The second oxide layer 320 has a thickness d2. The etching of the second oxide layer 320 is preferentially compliant. The second oxide layer 320 is then covered by a second electrode 200 (FIG. 9D).

As such, in a first zone 301, the electrodes 100, 200 are separated by a distance d1, corresponding to the sum of the thickness e1 of the first oxide layer 310 and of the thickness d2 of the second oxide layer 320. The distance d2 is less than the distance d1. In a second zone 302 where there pattern 900 is formed, the electrodes 100, 200 are separated by a distance d2, corresponding to the thickness d2 of the second oxide layer 320. Advantageously, the first zone 301 surrounds the second zone 302. According to another embodiment, the first zone 301 is located on either side of the of the second zone 302.

The distance d2 is therefore only controlled by the thickness of the deposit of the second layer. This thickness can as such be controlled very precisely.

Moreover, the two surfaces of the oxide layer on the second layer is intact. In particular, the face facing the electrode 200 was not damaged by etching. The performance of the device is improved.

This invention as such proposes a method of realization that makes it possible to form a memory device of which the stability of the performance cycle after cycle can be potentially improved by the determination of a ratio between the nominal distance d1, d2 between the electrodes 100, 200 and the contact surface of the electrodes 100, 200 with the oxide layer 300.

This invention is not limited to the embodiments described hereinabove but extends to all the embodiments compliant with its spirit.

The invention claimed is:

1. A memory device, comprising:
a first electrode;
a second electrode; and
an oxide layer arranged between the first electrode and the second electrode,
wherein:
the oxide layer has a first zone and a second zone;
with respect to a horizontal plane of the oxide layer, the first zone completely surrounds the second zone;
a minimum distance d2 separating the first and second electrodes on the second zone is less than a minimum distance d1 separating the first and second electrodes on the first zone;
a ratio between a surface area of at least one electrode of the first and second electrodes facing the second zone and a surface area of the at least one electrode of the first and second electrodes facing the first zone is from 0.0001 to 0.5; and
at least one of the first and second electrodes is a patterned electrode comprising a concave pattern on an exterior surface of the patterned electrode facing away from the oxide layer, in which a surface area of the concave pattern corresponds to the surface area of the at least one of the first and second electrodes facing the second zone.

2. The memory device according to claim 1, wherein a ratio between the minimum distance d2 and the minimum distance d1 is from 0.2 to 0.7.

3. The memory device according to claim 1, wherein:
at least one electrode of the first and second electrodes is in contact with the second zone; and
a ratio between a surface area through which the at least one electrode faces the second zone and a surface area through which the at least one electrode faces the first zone is from 0.0001 to 0.5.

4. The memory device according to claim 1, wherein at least one of the first and second electrodes is a non-inert electrode able to react with the oxide layer to create oxygen vacancies or defects in said oxide layer when a voltage is applied to the device.

5. The memory device according to claim 4, wherein the oxide layer is in direct contact with the non-inert electrode on the second zone and on the first zone.

6. The memory device according to claim 4, wherein a surface area of the non-inert electrode facing the first zone is from 0.01 to 10 square micrometers.

7. The memory device according to claim 4, wherein a surface area of the non-inert electrode facing the second zone is from 0.0001 to 0.25 square micrometers.

8. The memory device according to claim 4, wherein:
the oxide layer is in direct contact with one of the first and second electrodes on the second zone; and
the oxide layer comprises at least one intermediate layer between the oxide layer and the non-inert electrode on the first zone.

9. The memory device according to claim 1, wherein:
the oxide layer comprises a first oxide layer and a second oxide layer overmounting the first oxide layer in the first zone; and
the minimum distance d2 that separates the first and second electrodes on the second zone is equal to a thickness of the second oxide layer.

10. The memory device according to claim 1, wherein the minimum distance d1 is from 5 to 20 nm.

11. The memory device according to claim 1, wherein the minimum distance d2 is from 2 to 15 nm.

12. The memory device according to claim 1, wherein the minimum distance d1 is from 5 to 15 nm and the minimum distance d2 is from 2 to 10 nm.

13. The memory device according to claim 1, wherein:
the minimum distance d1 is from 5 to 15 nm, and the minimum distance d2 is from 2 to 10 nm;
the surface area of at least one electrode of the first and second electrodes facing the first zone is from 0.01 to 10 square micrometers; and
the surface area of the at least one electrode of the first and second electrodes facing the second zone is from 0.0001 to 0.25 square micrometers.

14. The memory device according to claim 1, wherein:
at least one of the first and second electrode extends mainly in a plane; and
the second zone is delimited by flanks that extend perpendicularly to said plane.

15. A microelectronic device, comprising the memory device according to claim 1.

16. A method for producing the memory device of claim 1, the method comprising:
forming the oxide layer arranged between the first electrode and the second electrode,
wherein:
the oxide layer has the first zone and the second zone,
with respect to the horizontal plane of the oxide layer, the first zone completely surrounds the second zone, and
the minimum distance d2 separating the first and second electrodes on the second zone is less than the minimum distance d1 separating the first and second electrodes on the first zone,
the method further comprises, prior to the forming the oxide layer, locating a formation of at least one conductive filament in the second zone by applying a voltage to the device according to the minimum distances d1, d2, and according to the surface area of at least one electrode of the first and second electrodes facing the first zone and according to the ratio between the surface area through which at least one electrode of the first and second electrodes faces the first zone and the surface area through which the at least one electrode faces the second zone,
wherein the locating the formation of the at least one conductive filament comprises determining the ratio between the surface area via which at least one electrode of the first and second electrodes faces the second zone and the surface area via which the at least one electrode faces the first zone to be from 0.0001 to 0.5.

17. The method according to claim 16, wherein the locating the formation of the at least one conductive filament further comprises determining a ratio between the distance d2 and the distance d1, to be from 0.2 to 0.7 so that the conductive filament is formed in the second zone.

18. The method according to claim 16, wherein the forming the oxide layer carried out in such a way that the oxide layer has the first zone and the second zone comprises:
forming the oxide layer on one electrode of the first and second electrodes;
thinning the oxide layer to form the second zone; and
depositing the other electrode of the first and second electrodes on the oxide layer.

19. The method according to claim 18, wherein a thickness of the oxide layer, after the thinning, on the second zone, is equal to the minimum distance d2.

20. The method according to claim 16, wherein the forming the oxide layer carried out in such a way that the oxide layer has the first zone and the second zone comprises:
forming a first oxide layer on one electrode of the first and second electrodes;
removing the first oxide layer only on the second zone to expose the one electrode of the first and second electrodes on the second zone;
depositing a second oxide layer on the first oxide layer and on the one electrode of the first and second electrodes exposed on the second zone; and
depositing the other electrode of the first and second electrodes.

21. The method according to claim 20, wherein a thickness of the second oxide layer deposited is equal to the minimum distance d2.

22. The method according to claim 16, wherein the forming the oxide layer carried out in such a way that the oxide layer has the first zone and the second zone comprises:
forming a first oxide layer on one electrode of the first and second electrodes;
forming at least one masking layer and producing guiding patterns in the one masking layer;
depositing a diblock copolymer in the guiding patterns, wherein the diblock copolymer forms, in each guiding pattern, a first polymer and a second polymer, and the first polymer surrounds or is located on either side of the second polymer;
completely removing the second polymer by leaving the first polymer in place to form a hollow pattern facing the oxide layer;
etching a portion of the oxide layer which is located straight with the hollow pattern;
removing the first polymer; and
forming the other electrode of the first and second electrodes.

23. The method according to claim 22, wherein:
the etching the portion of the oxide layer is etching only a partial amount of a thickness of the oxide layer and to retain a portion of the thickness of the oxide layer; and
the portion of the thickness is equal to the minimum distance d2.

24. The method according to claim 22, wherein:
the etching the portion of the oxide layer is etching an entire amount of a thickness of the oxide layer to expose the electrode whereon the oxide layer rests in a zone intended to form the second zone; and
the method further comprises, after the removing and before the forming the other electrode, depositing another oxide layer, while a thickness of said another oxide layer is equal to the minimum distance d2.

25. The method according to claim 16, Wherein at least one of the first and second electrodes is a non-inert electrode to react with the oxide layer to create oxygen vacancies or defects in said oxide layer when a voltage is applied to the device.

* * * * *